(12) United States Patent
Chang

(10) Patent No.: US 9,122,164 B2
(45) Date of Patent: Sep. 1, 2015

(54) LITHOGRAPHY MATERIAL AND LITHOGRAPHY PROCESS

(75) Inventor: Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 61 days.

(21) Appl. No.: 13/111,534

(22) Filed: May 19, 2011

(65) Prior Publication Data
US 2011/0229829 A1 Sep. 22, 2011

Related U.S. Application Data

(63) Continuation of application No. 11/828,809, filed on Jul. 26, 2007, now abandoned.

(60) Provisional application No. 60/941,005, filed on May 31, 2007.

(51) Int. Cl.
*G03F 7/26* (2006.01)
*G03F 7/20* (2006.01)
*G03F 7/004* (2006.01)

(52) U.S. Cl.
CPC ............ *G03F 7/2041* (2013.01); *G03F 7/0046* (2013.01)

(58) Field of Classification Search
CPC ..... G03F 7/004; G03F 7/0046; G03F 7/0048; G03F 7/20; G03F 7/2041
USPC ............... 430/322, 325, 330, 331, 270.1, 311
See application file for complete search history.

(56) References Cited

U.S. PATENT DOCUMENTS

| | | | |
|---|---|---|---|
| 4,123,931 A | 11/1978 | Blaser | |
| 4,554,237 A | 11/1985 | Kataoka et al. | |
| 6,451,510 B1 * | 9/2002 | Messick et al. | 430/311 |
| 6,605,409 B2 | 8/2003 | Kodama et al. | |
| 6,613,499 B2 | 9/2003 | Chang | |
| 6,653,415 B1 | 11/2003 | Bottcher et al. | |
| 6,660,828 B2 * | 12/2003 | Thomas et al. | 528/402 |
| 6,753,071 B1 * | 6/2004 | Pacetti | 428/212 |
| 6,770,404 B1 | 8/2004 | Wheland et al. | |
| 6,818,148 B1 | 11/2004 | Watanabe et al. | |
| 6,964,840 B2 * | 11/2005 | Nishimura et al. | 430/270.1 |
| 7,189,493 B2 | 3/2007 | Hatakeyma et al. | |
| 2005/0084794 A1 * | 4/2005 | Meagley et al. | 430/270.1 |
| 2005/0106498 A1 | 5/2005 | Cao et al. | |
| 2005/0123687 A1 * | 6/2005 | Jacobs et al. | 427/457 |
| 2005/0202347 A1 | 9/2005 | Houlihan et al. | |
| 2006/0078823 A1 * | 4/2006 | Kanda et al. | 430/270.1 |
| 2006/0223001 A1 * | 10/2006 | Nishimura et al. | 430/270.1 |
| 2006/0228648 A1 * | 10/2006 | Ohsawa et al. | 430/270.1 |
| 2008/0166667 A1 | 7/2008 | Goldfarb | |
| 2008/0280230 A1 * | 11/2008 | Chang et al. | 430/312 |

OTHER PUBLICATIONS

"NOVEC Engineered Fluids for Wet Cleaning of Dry Etcher Parts," 3M Company, Jul. 2001, 4 pgs.
"NOVEC 4300 Electronic Surfactant," 3M Company, Sep. 2005, 4 pages.
Material Safety Data Sheet FC-40 Fluorinert Brand Electronic Liquid, 3M Company, Mar. 9, 2010, 8 pgs.
"3M Material Safety Data Sheet FC-43 Fluorinert Brand Electronic Liquid," 3M Company, Apr. 26, 2005, 7 pgs.
"3M Material Safety Data Sheet FC-70 Fluorinert Brand Electronic Liquid," 3M Company, Mar. 13, 2007, 7 pgs.
"3M Material Safety Data Sheet FC-72 Fluorinert Brand Electronic Liquid," 3M Company, Apr. 26, 2005, 8 pgs.
"Material Safety Data Sheet FC-77 Fluorinert Brand Electronic Liquid," 3M Company, Apr. 28, 2009, 8 pgs.
"3M Material Safety Data Sheet FC-84 Fluorinert Brand Electronic Liquid," 3M Company, Mar. 23, 2007, 7 pgs.
"Material Safety Data Sheet 3M NOVEC Fluorosurfactant FC-4432," 3M Company, Apr. 8, 2009, 9 pgs.
"Material Safety Data Sheet 3M NOVEC Fluorosurfactant FC-4434," 3M Company, Apr. 8, 2009, 9 pgs.
"Material Safety Data Sheet 3M NOVEC Engineered Fluid HFE-7000," 3M Company, Apr. 17, 2009, 8 pgs.
"Material Safety Data Sheet 3M NOVEC 4200 Electronic Surfactant," 3M Company, Jan. 26, 2010, 8 pgs.
"Material Safety Data Sheet 3M NOVEC 7500 Engineered Fluid," 3M Company, Feb. 19, 2010, 8 pgs.

* cited by examiner

*Primary Examiner* — Anca Eoff
(74) *Attorney, Agent, or Firm* — Haynes and Boone, LLP

(57) ABSTRACT

An immersion lithography resist material comprising a matrix polymer having a first polarity and an additive having a second polarity that is substantially greater than the first polarity. The additive may have a molecular weight that is less than about 1000 Dalton. The immersion lithography resist material may have a contact angle that is substantially greater than the contact angle of the matrix polymer.

16 Claims, 6 Drawing Sheets

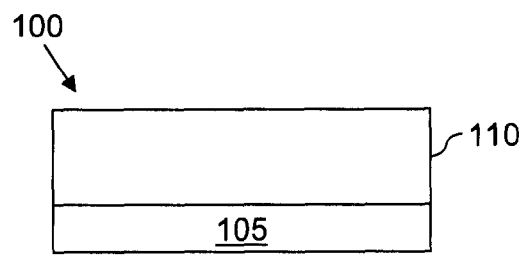
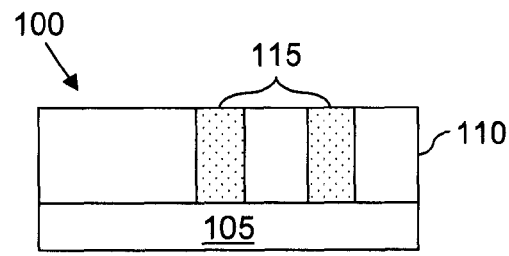
*Fig. 1A*
PRIOR ART
*Fig. 1B*
PRIOR ART
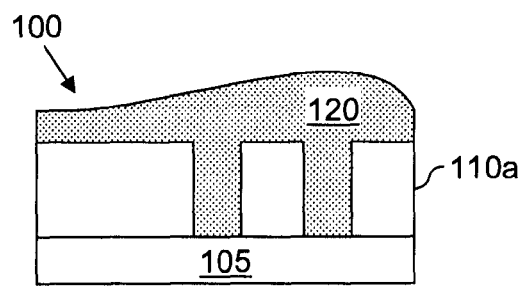
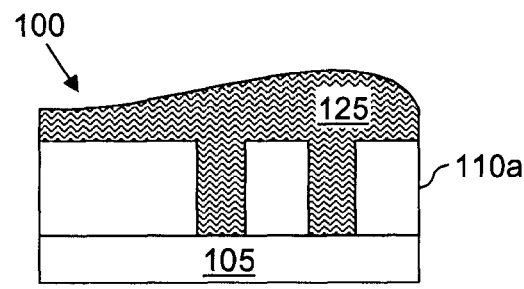
*Fig. 1C*
PRIOR ART
*Fig. 1D*
PRIOR ART
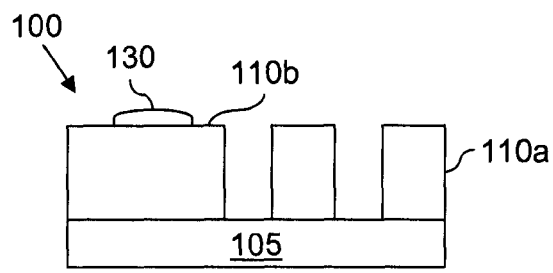
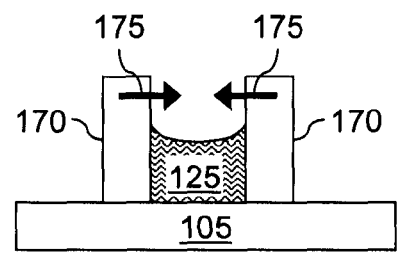
*Fig. 1E*
PRIOR ART
*Fig. 1J*
PRIOR ART

LITHOGRAPHY MATERIAL AND LITHOGRAPHY PROCESS

CROSS-REFERENCE TO RELATED APPLICATIONS

This application is a continuation of U.S. patent application Ser. No. 11/828,809, filed on Jul. 26, 2007, which claims benefit of U.S. Provisional Patent Application Ser. No. 60/941,005, filed on May 31, 2007, both of which are hereby incorporated herein by reference.

This application is related to commonly-assigned U.S. patent application Ser. No. 11/746,202, filed on May 9, 2007, which claims benefit of U.S. Provisional Patent Application Ser. No. 60/799,303 filed on May 10, 2006, both of which are hereby incorporated herein by reference.

BACKGROUND

Conventionally, fabrication of a photoresist pattern begins by forming a resist layer on a semiconductor substrate, possibly followed by heating the resist layer to, for example, evaporate any solvent. The desired pattern is then transferred to the resist layer by exposing the resist layer using, for example, an immersion lithography tool. After an optional post-exposure bake is performed, the exposed resist layer is developed using a developer rinse. A subsequent deionized (DI) water rinse then removes the unwanted portions of the resist layer, leaving the resist pattern on the substrate. Spin drying may be subsequently employed to remove any remaining droplets of deionized water. However, while this process for fabricating a photoresist pattern is well known and practiced, it does have its shortcomings.

For example, the resist pattern may have a high contact angle, which can induce developer watermarks. During the spin drying step, the DI water is spun away from the wafer center towards the wafer edge. Consequently, the DI water drops become smaller and smaller and can ultimately become so small that they adhere to the resist surface. That is, if the van der Waals force holding the DI water droplet to the resist surface becomes greater than the centrifugal force urging the droplet away from the wafer, then the droplet will remain on the resist surface. Moreover, because the DI water is utilized to rinse away the exposed (or unexposed) resist, the DI wafer can retain soluble polymers and other chemicals from the exposed (or unexposed) resist. Consequently, if the DI water droplet is allowed to evaporate on the resist surface, the polymers and other chemicals in the droplet result in a stain on the resist surface, and can therefore become a defect source. For example, if the stain covers a patterned hole in the resist, it would result in a blind contact.

Thus, while some kinds of polymers may exhibit good lithographic performance, many may also have a high contact angle which can induce developer water mark defects. In contrast, other kinds of polymers have a lower contact angle, and therefore decrease the occurrence of developer watermark defects, but these polymers often do not exhibit acceptable lithographic performance.

Nonetheless, there are chemical treatments which can reduce the contact angle after the developing DI rinse is performed. However, such treatment chemicals can become residue that also gets captured in the DI droplets, which can dissolve the resist pattern and also become a defect source.

Moreover, if the polymer contact angle is too low, the immersion fluid utilized during an immersion lithography exposure process can also form water drop and defect residue on the resist surface. Such water drop residue and defect residue can, thus, also become a defect source, often referred to as an immersion watermark and immersion fall-on defect.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A is a sectional view of a conventional apparatus in an intermediate stage of manufacture.

FIG. 1B is a sectional view of the apparatus shown in FIG. 1A in a subsequent stage of manufacture.

FIG. 1C is a sectional view of the apparatus shown in FIG. 1B in a subsequent stage of manufacture.

FIG. 1D is a sectional view of the apparatus shown in FIG. 1C in a subsequent stage of manufacture.

FIG. 1E is a sectional view of the apparatus shown in FIG. 1D in a subsequent stage of manufacture.

FIG. 1J is a sectional view of an embodiment of the apparatus shown in FIG. 1E.

DETAILED DESCRIPTION

Figure 1F:
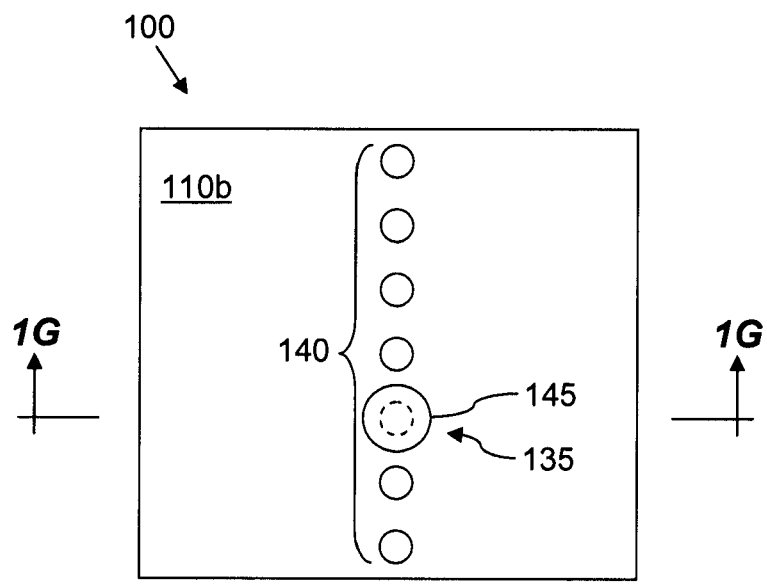
FIG. 1F is a top view of an embodiment of the apparatus shown in FIG. 1E.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1A, illustrated is a sectional view of a conventional semiconductor device 100 during an intermediate stage of manufacture. The device 100 includes a substrate or wafer 105, on which a photoresist or resist layer 110 has been formed by one or more well-known processes.

Referring to FIG. 1B, illustrated is a sectional view of the device 100 shown in FIG. 1A in a subsequent stage of manufacture. The resist layer 110 has been exposed, thereby transferring a desired pattern thereto. For example, portions 115 of the resist layer 110 may be exposed using an immersion lithography tool, such that the exposed portions 115 may be subsequently removed.

Referring to FIG. 1C, illustrated is a sectional view of the device 100 shown in FIG. 1B in a subsequent stage of manufacture. The exposed resist layer 110 is undergoing a developing step in which the layer 110, including exposed portions 115, are immersed or otherwise subjected to a developer rinse fluid 120. The developer rinse 120 dissolves or otherwise removes the exposed portions 115 of the resist layer 110 without substantially affecting the remaining, unexposed portions of the resist layer 110, thereby forming a patterned resist layer 110a.

Referring to FIG. 1D, illustrated is a sectional view of the device 100 shown in FIG. 1C in a subsequent stage of manufacture. The patterned resist layer 110a is rinsed with DI water 125 to remove residue left behind after the developer rinse. Thereafter, the device 100 undergoes spin-drying and/or other drying processes to remove the DI water 125.

Referring to FIG. 1E, illustrated is a sectional view of the device 100 shown in FIG. 1D after the DI water 125 is dried. As described above, the DI water 125 can become contaminated by residual developer rinse, residual exposed resist, and/or other chemicals. Consequently, when the DI water 125 dries on the upper surface 110b of the patterned resist layer 110a, these contaminants 130 can adhere to the surface 110b. The adherence of the contaminants 130 to the surface 110b can be the result of one or more factors. For example, the contaminants 130 can be contained in DI water droplets which, during spin-drying, become so small that the van der Waals forces holding the droplets to the surface 110b become greater than the centrifugal force flinging the droplets outwards. Consequently, the droplets remain on the surface 110b through the spin-drying and afterwards dry on the surface 110b. This problem is exacerbated when the resist layer material 110 has a high surface contact angle, which increases the adherence of droplets to the surface 110b.

Figure 1G:
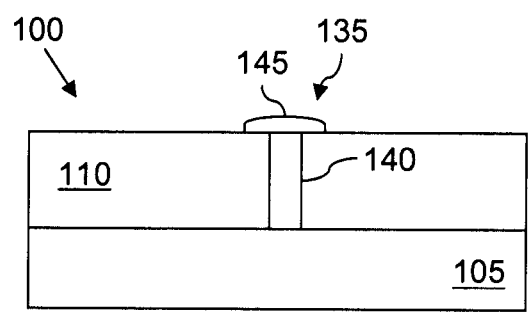
FIG. 1G is a sectional view of the apparatus shown in FIG. 1F.

FIG. 1F is a plan view of a portion of the device 100 shown in FIG. 1E demonstrating an example defect referred to as a blind contact hole 135. FIG. 1G is a sectional view of the device 100 shown in FIG. 1F. Referring to FIGS. 1F and 1G, collectively, the desired pattern to be formed into the resist layer 110 comprises a plurality of contact holes 140. However, one of the contact holes 140 is covered by a contaminant 145 which adhered to the surface 110b of the resist layer 110 when the DI water rinse dried. Consequently, although the contact hole 140 underneath the contaminant 145 was formed, it will result in a defect during use of the resist layer 110 because it is covered by the contaminant 145.

Figure 1H:
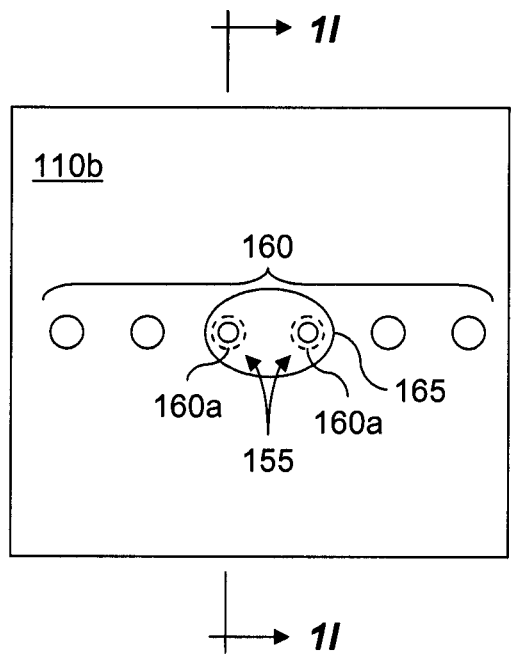
FIG. 1H is a top view of an embodiment of the apparatus shown in FIG. 1E.
Figure 1I:
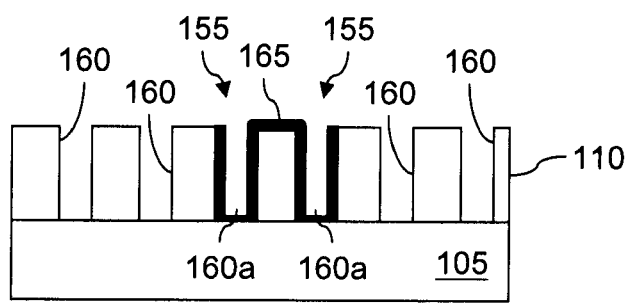
FIG. 1I is a sectional view of the apparatus shown in FIG. 1H.

FIG. 1H is a plan view of a portion of the device 100 shown in FIG. 1E demonstrating an example defect referred to as scum contact holes 155. FIG. 1I is a sectional view of the device 100 shown in FIG. 1H. Referring to FIGS. 1H and 1I, collectively, the desired pattern to be formed into the resist layer 110 comprises a plurality of contact holes 160. However, two of the contact holes 160a are coated by contaminants 165 which adhered to the surface 110b of the resist layer 110 and surfaces of the contact holes 160a when the DI water rinse dried. Consequently, although the contact holes 160 were formed, they will result in a defect during use of the resist layer 110 because they are coated by the contaminants 165.

Referring to FIG. 1J, illustrated is a perspective sectional view of a portion of the device 100 shown in FIG. 1E demonstrating an example defect referred to as pattern collapse. When liquid settles between two adjacent resist pattern members 170, as shown in FIG. 1J, the capillary or Laplace force between the two adjacent resist pattern members 170 can bend the members 170 inward. Consequently, this bending force 175 can induce pattern collapse, such that the two adjacent resist pattern members 170 collapse into each other. The resist pattern members 170 can be particularly susceptible to collapse during the initial phase of spin-drying, such as perhaps when a substantial amount of liquid still remains in the recess/cavity between the adjacent resist pattern members 170.

Figures 2A, 2B, 2C:
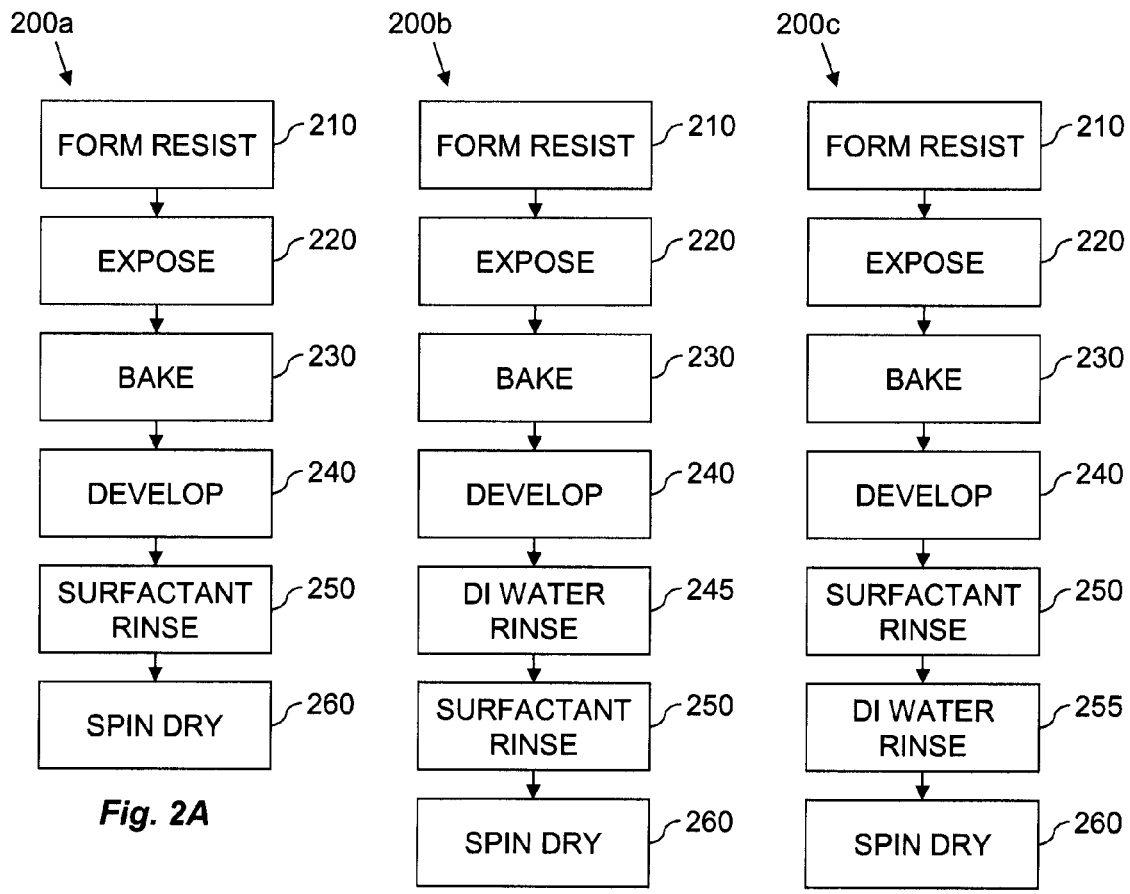
FIG. 2A is a flow-chart diagram of an embodiment of a method according to one or more aspects of the present disclosure.
FIG. 2B is a flow-chart diagram of an embodiment of the method shown in FIG. 2A.
FIG. 2C is a flow-chart diagram of an embodiment of the method shown in FIG. 2A.

Referring to FIG. 2A, illustrated is a flow-chart diagram of at least a portion of a method 200a of immersion lithography formation of a resist pattern according to one or more aspects of the present disclosure. The method 200a includes a step 210 during which a resist layer is formed over or on a substrate or wafer. In a subsequent step 220, the resist layer is exposed using an immersion lithography tool, which may be conventional or future-developed. Accordingly, the desired pattern can be initially transferred to the resist layer. The method 200a may also include a step 230 during which the exposed resist layer is baked employing one or more conventional or future-developed processes.

The method 200a also includes a step 240 during which the exposed resist layer is developed by immersing the wafer in a developer fluid, or by otherwise subjecting the exposed resist layer to the developer fluid. Developing the exposed resist layer may employ a developer fluid containing 2.38% TMAH, although other developer fluids are also within the scope of the present disclosure.

In a subsequent step 250, the developed resist layer is rinsed by immersing the wafer in a liquid containing fluorine or a surfactant, or by otherwise subjecting the developed resist layer to such liquid. The liquid may be or comprise 3M Novec™ 4200, 3M FC-4434, 3M Novec™ 4300, 3M FC-4432, 3M Novec™ fluid HFE-7000, 3M Novec™ fluid HFE-7100, 3M Novec™ fluid HFE-7200, 3M Novec™ fluid HFE-7500, 3M Novec™ fluid HFE-71IPA, 3M Fluorinert™ FC-72, 3M Fluorinert™ FC-84, 3M Fluorinert™ FC-77, 3M Fluorinert™ FC-3255, 3M Fluorinert™ FC-3283, 3M Fluorinert™ FC-40, 3M Fluorinert™ FC-43, 3M Fluorinert™ FC-70, and/or 3M FC-4430. In an exemplary embodiment, the liquid has a fluorine concentration, by weight, based on active content, ranging between about 1 ppm and about 50,000 ppm. For example, such fluorine concentration may range between about 100 ppm and about 5000 ppm.

In an exemplary embodiment, the fluorine surfactant may be or contain a composition according to the formula: $Rf-SO_3^-M^+$, where the Rf is a C1 to C12 perfluoroalkyl group, and $M^+$ is a cation, a $H^+$ atom or an ammonia group. In an exemplary embodiment, the fluorine surfactant may be or contain a composition according to the formula: $Rf-SO_2N^--R^1M^+$, where the Rf is a C1 to C12 perfluoroalkyl group; $R^1$ is H, an alkyl group, a hydroxyalkyl group, an alkylamine oxide group, an alkylcarboxylate group or aminoalkyl group; and $M^+$ is a cation, a $H^+$ atom or an ammonia group. The alkyl, hydroxylalkyl, alkylamine oxide, alkylcarboxylate or aminoalkyl groups of $R^1$ groups may have from 1 to 6 carbon atoms. The hydroxylalkyl group may have the formula —$(CH_2)$x-OH, where x is an integer from 1 to 6.

In an exemplary embodiment, the fluorine surfactant may be or contain a composition according to the formula: Rf-Q-$R^1SO_3^-M^+$, where the Rf is a C1 to C12 perfluoroalkyl group; $R^1$ is alkylene of the formula —CnH2n(CHOH)oCmH2m-, the n and m are independently 1 to 6 and o is 0 to 1, and is optionally substituted by a catenary oxygen or nitrogen group; $M^+$ is a cation; Q is —O— or —$SO_2NR^2$—; and the $R^2$— is an H—, alkyl, aryl, hydroxyalkyl, aminoalkyl, or sulfonatoalkyl group, optionally containing one or more catenary oxygen or nitrogen heteroatoms. The alkyl, aryl, hydroxyalkyl, aminoalkyl, or sulfonatoalkyl group may have from 1 to 6 carbon atoms. The hydroxyalkyl group may be of the formula —$C_pH_{2p}$—OH, where the p is an integer from 1 to 6. The aminoalkyl group may be of the formula —$C_pH_{2p}$—$NR^3R^4$, where the p is an integer of 1 to 6 and $R^3$ and $R^4$ are independently H or alkyl groups of 1 to 6 carbon atoms. The $R^1$ group is —CnH2nCH(OH)CmH2m-, and the n and m are independently 1 to 6.

In an exemplary embodiment, the liquid has a fluorine concentration, by weight, based on active content, ranging between about 1 ppm and about 50,000 ppm. For example, such fluorine concentration may range between about 100 ppm and about 5000 ppm.

The method 200a may also include a spin-dry step 260 to further remove any liquids and/or solids remaining on the patterned resist layer after the rinse step 250. The spin-dry step 260 may include one or more conventional or future-developed processes.

The surfactant rinse after the DI rinse may aid in replacing the DI water with the surfactant-containing liquid, which has a lower surface tension than DI water. Consequently, after the DI water is replaced by surfactant-containing liquid, the surfactant-containing liquid can more easily be washed away during the spin-dry step. Therefore, using the surfactant-containing liquid may prevent water drop formation which, as described above, can result in defects. The surfactant-containing liquid may also be used after the developer rinse, directly replacing the DI rinse.

When a conventional DI rinse is used, the resist surface may have a charge effect (e.g., electrical static discharge) which may influence scanning electron microscopy (SEM) measurements. The SEM electron-beam may be influenced by the wafer surface ESD, which can adversely affect the SEM measurement accuracy and/or efficiency. However, by rinsing with the surfactant-containing liquid, this ESD effect may be reduced at the same time.

Thus, the surfactant-containing liquid rinse described herein, when used in conjunction with or in place of the DI water rinse, can have several distinct functions. First, the surfactant-containing liquid may reduce developer watermark defects. Second, due to its low surface tension, the surfactant-containing liquid can also increase the resist pattern aspect ratio while avoiding the pattern member collapse defect described above. Third, the surfactant-containing liquid rinse can be used for general defect reduction. In contrast, conventional use of surfactants in lithography resist pattern fabrication does not offer the same functions.

The surfactant-containing liquid within the scope of the present disclosure may be or comprise an ionic fluorine surfactant, which provides good rinsing performance without damaging the resist film. In contrast, conventional surfactant use can be harmful to the resist pattern, and may dissolve the resist pattern.

Moreover, the surfactant-containing liquid can be or comprise off-the-shelf, industry-standard or otherwise widely available materials. In contrast, conventional PFOS surfactant cannot be used anymore.

In addition, the surfactant-containing liquid of the present disclosure can be used in a variety of chemical rinse recipes, including when rinsing the wafer between developing and DI rinsing and between DI rinsing and spin-drying. In contrast, conventional surfactant can only be used between the DI rinse and the spin-drying.

As mentioned above, use of the surfactant-containing liquid according to aspects of the present disclosure may reduce the risk of resist pattern collapse. When developing the resist pattern, the capillary force between two adjacent resist pattern members can bend the resist members and induce pattern collapse, particularly during the initial phase of spin-drying. However, if the surfactant-containing liquid is used in place of the DI water, the capillary force may be reduced, such that the collapse force may also be reduced. The surfactant-containing liquid can be processed after DI rinse or directly replace the DI rinse after developer rinse.

The surfactant-containing liquid may also clean the wafer surface during the dispense process. The ionic or non-ionic surfactant-containing liquid may cause the wafer surface and any particles thereon have the same electrical charge, such that the particles may be repulsed from the wafer surface.

One purpose of the surfactant rinse within the scope of the present disclosure is to reduce the resist surface contact angle. If the rinse liquid surface tension is less than that of the DI water, the rinsing fluid may be used to reduce the water drop residue and reduce the watermark defect. As shown in Table 1 and Table 2 below, therefore, the effective concentration may vary from about 100 ppm to about 0.5%. However, other concentrations are also within the scope of the present disclosure.

TABLE 1

Surface Tension of L-18691 Surfactant Solutions (dynes/cm)

| | Amount of L-18691 surfactant by weight based on active content | | | |
|---|---|---|---|---|
| Solvent | 0 ppm | 100 ppm (0.01%) | 200 ppm (0.02%) | 500 ppm (0.05%) |
| 7:1 Buffered HF (BHF) | 86 | <22 | <21 | <19 |
| 500:1 Buffered HF (BHF) | 93 | <18 | <18 | <18 |

TABLE 2

Surface Tension of L-18691 Surfactant Solutions (dynes/cm)

| | Amount of L-18691 surfactant by weight based on active content | | |
|---|---|---|---|
| Solvent | 0 ppm | 500 ppm (0.05%) | 2000 ppm (0.2%) |
| Water | 73 | 57 | 37 |
| 18.5% Hydrochloric acid | 63 | 31 | 21 |
| 40% Nitric acid | 54 | 43 | 31 |
| 50% Sulfuric acid | 67 | 26 | 21 |
| 10% Potassium hydroxide | 77 | 49 | 29 |
| 85% Phosphoric acid | 78 | 34 | 27 |
| 100:1 Dilute HF | 71 | 32 | <18 |
| 500: dilute HF | 71 | 24 | <18 |

Referring to FIG. 2B, illustrated is a flow-chart diagram of at least a portion of a method 200b of immersion lithography formation of a resist pattern according to one or more aspects of the present disclosure. The method 200b, or one or more of the steps thereof, may be similar to the method 200a shown in FIG. 2A, or one or more of the steps thereof, as indicated by similar references numerals. For example, the method 200b includes the step 210 during which a resist layer is formed over or on a substrate or wafer. In subsequent step 220, the resist layer is exposed using an immersion lithography tool, which may be conventional or future-developed. Accordingly, the desired pattern is initially transferred to the resist layer. The method 200b may also include step 230 during which the exposed resist layer is baked employing one or more conventional or future-developed processes.

The method 200b also includes step 240 during which the exposed resist layer is developed by immersing the wafer in developer fluid, or by otherwise subjecting the exposed resist layer to developer fluid. The developer fluid may contain 2.38% TMAH, although other developer fluids are also within the scope of the present disclosure.

Thereafter, during a step 245, the exposed resist layer is rinsed with DI water to remove the exposed (or unexposed) portions of the resist layer. However, the DI water rinse step 245 may not fully remove all contaminates from the resist layer, such as where residual portions of the exposed/developed resist layer remains on one or more surfaces of the resist layer and/or wafer. Consequently, the above-described step 250 may be performed, such that the resist layer is rinsed by immersing the wafer in liquid containing fluoride or a surfactant, or by otherwise subjecting the developed resist layer to such liquid.

The method 200b may also include the spin-dry step 260 to further remove any liquids and/or solids remaining on the patterned resist layer after the DI water rinse step 245 and the surfactant rinse step 250. The spin-dry step 260 may include one or more conventional or future-developed processes.

Referring to FIG. 2C, illustrated is a flow-chart diagram of at least a portion of a method 200c of immersion lithography formation of a resist pattern according to one or more aspects of the present disclosure. The method 200c, or one or more of the steps thereof, may be similar to the method 200a shown in FIG. 2A and/or the method 200b shown in FIG. 2B, or one or more of the steps thereof, as indicated by similar references numerals. For example, the method 200c includes the step 210 during which a resist layer is formed over or on a substrate or wafer. In subsequent step 220, the resist layer is exposed using an immersion lithography tool, to transfer the desired pattern to the resist layer. The method 200c may also include step 230 during which the exposed resist layer is baked employing one or more conventional or future-developed processes.

The method 200c also includes step 240 during which the exposed resist layer is developed by immersing the wafer in developer fluid, or by otherwise subjecting the exposed resist layer to developer fluid. The developer fluid may contain 2.38% TMAH, although other developer fluids are also within the scope of the present disclosure.

The above-described step 250 may be performed, such that the resist layer is rinsed by immersing the wafer in liquid containing fluoride or a surfactant, or by otherwise subjecting the developed resist layer to such liquid. Thereafter, during a step 255, the resist layer is rinsed with DI water. The method 200c may also include the spin-dry step 260 to further remove any liquids and/or solids remaining on the patterned resist layer after the surfactant rinse step 250 and the DI water rinse step 255.

Figures 2D, 2E, 2F:
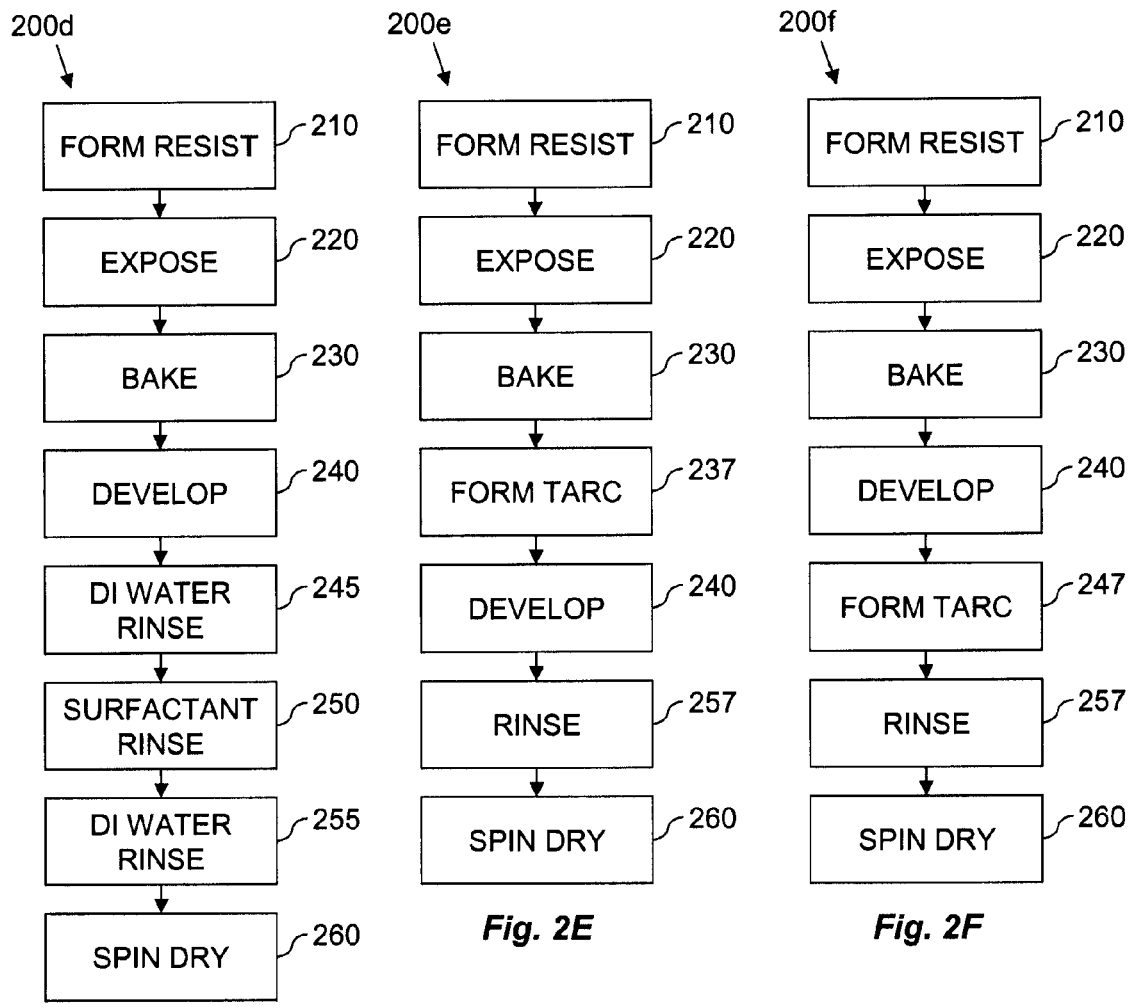
FIG. 2D is a flow-chart diagram of an embodiment of the method shown in FIG. 2A.
FIG. 2E is a flow-chart diagram of an embodiment of the method shown in FIG. 2A.
FIG. 2F is a flow-chart diagram of an embodiment of the method shown in FIG. 2A.

Referring to FIG. 2D, illustrated is a flow-chart diagram of at least a portion of a method 200d of immersion lithography formation of a resist pattern according to one or more aspects of the present disclosure. The method 200d, or one or more of the steps thereof, may be similar to one or more of the methods 200a-c shown in FIGS. 2A-C, respectively, or one or more of the steps thereof, as indicated by similar references numerals. For example, the method 200d includes the step 210 during which a resist layer is formed over or on a substrate or wafer. In subsequent step 220, the resist layer is exposed using an immersion lithography tool, to transfer the desired pattern to the resist layer. The method 200d may also include step 230 during which the exposed resist layer is baked employing one or more conventional or future-developed processes.

The method 200d also includes step 240 during which the exposed resist layer is developed by immersing the wafer in developer fluid, or by otherwise subjecting the exposed resist layer to developer fluid. The developer fluid may contain 2.38% TMAH, although other developer fluids are also within the scope of the present disclosure.

The above-described step 245 may be performed, such that the resist layer is rinsed by immersing the wafer in DI water, or by otherwise subjecting the developed resist layer to DI water. The above-described step 250 may then be performed, such that the resist layer is rinsed by immersing the wafer in liquid containing fluoride or a surfactant, or by otherwise subjecting the developed resist layer to such liquid. Thereafter, during a step 255, the resist layer may be rinsed with DI water again. The method 200d may also include the spin-dry step 260 to further remove any liquids and/or solids remaining on the patterned resist layer after the surfactant rinse step 250 and the DI water rinse steps 245 and 255.

Referring to FIG. 2E, illustrated is a flow-chart diagram of at least a portion of a method 200e of immersion lithography formation of a resist pattern according to one or more aspects of the present disclosure. The method 200e, or one or more of the steps thereof, may be similar to one or more of the methods 200a-d shown in FIGS. 2A-D, respectively, or one or more of the steps thereof, as indicated by similar references numerals. For example, the method 200e includes step 210 during which a resist layer is formed over or on a substrate or wafer. In subsequent step 220, the resist layer is exposed using an immersion lithography tool, to transfer the desired pattern to the resist layer. The method 200e may also include step 230 during which the exposed resist layer is baked employing one or more conventional or future-developed processes.

The method 200e also includes a step 237 during which an immersion top anti-reflective coating (TARC) layer is formed on the exposed resist layer. The method 200e also includes the above-described developing step 240 during which the exposed resist layer is developed by immersing the wafer in developer fluid, or by otherwise subjecting the exposed resist layer to developer fluid. The developer fluid may contain 2.38% TMAH, although other developer fluids are also within the scope of the present disclosure.

One or both of the above-described rinse steps 245 and 266 may then be performed during a rinse step 257. The method 200e may also include the spin-dry step 260 to further remove any liquids and/or solids remaining on the patterned resist layer after the rinse step 257.

Referring to FIG. 2F, illustrated is a flow-chart diagram of at least a portion of a method 200f of immersion lithography formation of a resist pattern according to one or more aspects of the present disclosure. The method 200f, or one or more of the steps thereof, may be similar to one or more of the methods 200a-e shown in FIGS. 2A-E, respectively, or one or more of the steps thereof, as indicated by similar references numerals. For example, the method 200f includes step 210 during which a resist layer is formed over or on a substrate or wafer. In subsequent step 220, the resist layer is exposed using an immersion lithography tool, to transfer the desired pattern to the resist layer. The method 200f may also include step 230 during which the exposed resist layer is baked employing one or more conventional or future-developed processes.

The method 200f also includes the above-described developing step 240 during which the exposed resist layer is developed by immersing the wafer in developer fluid, or by otherwise subjecting the exposed resist layer to developer fluid. The developer fluid may contain 2.38% TMAH, although other developer fluids are also within the scope of the present disclosure. The method 200f also includes a step 247 during which an immersion TARC layer or conventional top anti-reflective coating (TARC) is formed on the developed resist layer.

One or both of the above-described rinse steps 245 and 250 may then be performed during rinse step 257. The method 200f may also include the spin-dry step 260 to further remove any liquids and/or solids remaining on the patterned resist layer after the rinse step 257.

The immersion TARC layer described above in steps 237 and 247 does not dissolve in water, but can be dissolved in 2.38% TMAH developer fluid. The immersion TARC has a high dissolution rate, which can also decrease the resist surface contact angle and render it more hydrophilic. Therefore, the immersion TARC layer can help reduce the developer watermark defects described above.

The immersion TARC layer comprises different solvents and, thus, does not intermix with the resist layer. The immersion TARC layer also cannot be dissolved in DI water, and may only be dissolved in developer fluid. The immersion TARC layer may reduce leaching of the resist material into the exposure immersion fluid. The immersion TARC layer may also be used for reflectivity control, and may also be configured for surface contact angle control, such as to increase the original surface contact angle from about 70° to about 75°. In an exemplary embodiment, the immersion TARC layer can reduce developer watermarks due to its intermixing with the substrate polymer, which may increase the surface contact angle after removal of the TARC layer. The immersion TARC layer may comprise fluoride polymer, wherein the intermixing of the fluoride polymer may inhibit water drop residue during the subsequent developing process.

In an exemplary embodiment, a conventional TARC layer may also or alternatively be used for watermark defect reduction. For conventional dry exposure, the TARC layer may be used for reflectivity control. Since conventional TARC layers comprise surfactant, they can be used for surface contact angle and defect control. The surfactant contained in the TARC layer may help remove defects in the surface of the patterned resist layer even when the defect formation mechanism is due to an iso-electric point difference, excessive surface contact angle, or a zeta potential difference. Moreover, for developer watermark defect reduction, the TARC layer can be used before exposure, before developer, or after ADI. However, when used after ADI treatment, an additional DI water rinse may be needed to rinse away the TARC layer.

It is worth noting that the conventional dry-exposure TARC layer comprises different solvents which can not intermix with the substrate resist. The conventional dry-exposure TARC layer can be washed away by DI water. For example, it is normally washed away before the develop step. The purpose of such TARC layer is to reduce reflectivity during exposure process.

Another aspect introduced in the present disclosure is a resist material for low developer watermark defects, in which the resist material is mixed with a surfactant. That is, in conventional resist materials, no special surfactant is added for controlling the surface contact angle. However, a resist material according to one or more aspects of the present disclosure includes a special surfactant added for controlling surface contact angle of the resulting resist.

Adding the surfactant chemical into the resist material can aid in reducing water drop residue. Such a surfactant may float to the surface of the resist after the resist is formed, which can be advantageous, as described below. The surfactant may be an ionic or non-ionic type surfactant. The effective concentration may range between about 0.001% to about 5%.

For reducing developer induced watermarks, one possible method is to reduce the contact angle as low as possible. In contrast, fluoride material may also be used even when it is hydrophobic. The hydrophobic surfactant isolates the water drop interaction with the resist. Fluoride-containing surfactant may increase the resist surface contact angle, whereas conventional surfactant can decrease the resist surface contact angle.

According to one or more aspects of the present disclosure, fluoride polymer is added to increase the resist layer's resistance to water. Fluoride surfactant can extrude its fluoride end structure out towards the sides the polymer, while the polarity end is embedded inside the polymer matrix. This hydrophobic fluoride structure can thus provide resistance to water penetration and reaction to the substrate polymer. Thus, the fluoride structure can form a layer to prevent hydrogen bonding between the water drop and the matrix polymer.

Figure 3:
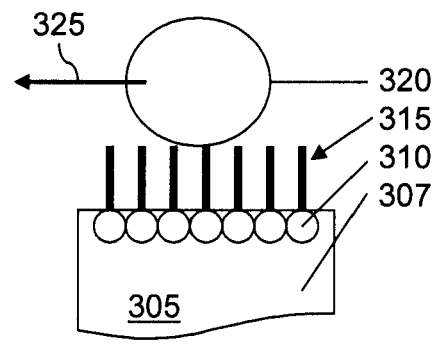
FIG. 3 is a sectional view of an embodiment of a resist layer according to one or more aspects of the present disclosure.

For example, referring to FIG. 3, illustrated is a sectional view of a resist layer 305, mixed with a fluoride-containing surfactant 310, after being formed on a substrate. The ionic units of the surfactant 310 have floated to the top of the resist layer 305, such that the fluoride units 315 extend upward from the resist layer 305. Consequently, the resist layer 305 has a very high surface contact angle. Accordingly, water droplets 320 cannot easily bond with the resist layer 305. Therefore, the water droplets 320 are more effectively removed from the resist layer 305 by the centrifugal force 325 of spin-drying.

As mentioned above, the fluoride surfactant can float to the resist surface after priming. The molecular weight and polarity are different between the surfactant and the matrix polymer, such that the surfactant is easily diffused to the surface. Therefore, the surfactant can maximize its water resistance function without influencing resist body lithography performance. Conventionally, a non-fluoride polymer is used to reduce the contact angle, but this often results in leaching to the fluid during the immersion exposure and developing. Therefore, after the DI water rinse, the surface surfactant concentration is reduced, and the surface contact angle is increased. Developer watermark defects may exist although the original surfactant additive can reduce the contact angle. Consequently, according to one or more aspects of the present disclosure, fluoride polymer is employed because it is resistant to water, such that it can exist on the resist surface until the final DI water rinse and the spin-dry step. The water-resistant fluoride polymer makes the surface water drops float, allowing them to be spun away easily during spin-drying. Therefore, the developer watermark defects can be reduced.

The surfactant that can be mixed with the resist can be a non-ionic surfactant, including: polyoxyethylene alkyl ethers, such as polyoxyethylene lauryl ether, polyethylene stearyl ether, polyoxyethylene cetyl ether, polyoxyethylene olein ether or the like; polyoxyethylene alkyl aryl ethers, such as polyoxyethylene octyl-phenol ether, polyoxyethylene nonyl phenol or the like; polyoxyethylene polyoxy propylene block copolymers; sorbitan fatty acid esters, such as sorbitan monolaurate, sorbitan monopalmitate, sorbitan monostearate or the like; and/or polyoxyethylene sorbitan fatty acid esters, such as polyoxyethylene sorbitan monolaurates, polyoxyethylene sorbitan monopalmitate, polyoxyethylene sorbitan-monostearate, polyoxyethylene sorbitan trioleate, polyoxyethylene sorbitan tristearate or the like. The fluorine surfactant may be or comprise 3M Novec™ fluid (e.g., HFE-7000, HFE-7100, HFE-7200, HFE-7500, HFE-71IPA), 3M Fluorinert™ (e.g., FC-72, FC-84, FC-77, FC-3255, FC-3283, FC-40, FC-43, FC-70), 3M Novec™ 4200, 3M Novec™ 4300, 3M FC-4432, 3M FC-4430, or 3M FC-4434.

Conventionally, surfactant is used for resist ingredient mixing uniformity control. In contrast, the surfactant of the present disclosure is used to change the resist surface condition. In the surfactant-resist mixture of the present disclosure, a polarity that is stronger than the matrix polymer is at issue, such that the surfactant can be easily diffused to the surface within intermixing with the matrix polymer, whereby the surface concentration is greater at the top of the resist layer than elsewhere. In contrast, in the prior art, the surfactant polarity is controlled to disperse or aid with ingredient mixing, such that the surfactant must be kept distributed within the resist polymer with good uniformity. Moreover, by using a fluorine-containing surfactant according to one or more aspects of the present disclosure, the surface contact angle of the resist layer will be increased relative to the conventional use of surfactants with resist layers. That is, for conventional resist polymers which incorporate surfactants, the surfactant actually decreases the surface contact angle of the resulting resist layer. Nonetheless, surfactants other than fluorine-containing surfactants may also be mixed with the resist polymer within the scope of the present disclosure, where such other surfactants decrease the surface contact angle of the resulting resist layer.

The inventors have also discovered that immersion water drops may adhere to the resist layer surface if the surface is too hydrophilic. Thus, experimentation has provided the unexpected results that, to reduce immersion watermark defects, the surface receding contact angle should be higher than 60°. One conventional method of achieving such contact angle is using high contact polymer or a hydrophobic additive material. However, such new polymers have new lithography characteristics and, therefore, require time in the lab and/or production facility before becoming mature enough to incorporate—which is disadvantageous. Another conventional method is using a high molecular weight additive. However, such an approach induces scum defects and adversely influences the lithography performance, particularly if not designed or mixed well.

In contrast, the present disclosure introduces a fluoride polymer that is added to increase resistance to water. A fluoride surfactant can extrude its fluoride end structure out of the side of the polymer, while the polarity end is embedded inside the polymer matrix. Such hydrophobic fluoride structure can provide resistance to water penetration and reaction to the substrate polymer. The fluoride structure can form a layer to prevent hydrogen bonding between water droplets and the matrix polymer.

As described above, the fluorine surfactant can float to the resist surface after priming. The molecular weight and polarity difference between the surfactant and the matrix polymer allows the surfactant to easily diffuse up to the resist surface. Therefore, the surfactant can maximize its water resistance function without influencing the resist body lithographic performance. Under the conventional approach, because the additive has higher molecular structure, the ability to diffuse into two phases is not as possible as with the approach introduced in the present disclosure, if possible at al.

According to the present disclosure, the fluorine-containing or other surfactant mixed with the resist material may have a concentration that is less than about 2%. In contrast, conventional resist materials which incorporate a surfactant (albeit for different reasons, and different surfactant materials) have a much higher surfactant concentration, which can actually decrease the surface contact angle.

Moreover, the fluorine-containing or other surfactant mixed with the resist material may have a molecular weight that is less than about 1000 dalton. The small molecular weight allows easy diffusion towards the surface of the resist matrix, results in less residue and less impact to resist performance. The small molecular weight polymer may also decrease the risk of pattern scum, as described above. In contrast, conventional surfactant-resist mixes employ a surfactant having a molecular weight larger than 2000 dalton. For example, an often used surfactant has a molecular weight of 7000 dalton, which is similar to that of the matrix polymer.

The effective concentration of the fluorine-containing or other surfactant according to the present disclosure may range between about 0.01% and about 3%. The low concentration additive has low risk of side effects, yet maintains the same lithographic performance and resist profile relative to not using a surfactant. In contrast, the surfactants mixed with resist in the prior art have a significantly higher concentration, which presents high risk of inducing side effects, adversely altering lithographic performance, and enhancing the likelihood of pattern scum formation.

Moreover, the small molecular weight of the fluorine-containing or other surfactant of the present disclosure can be easily removed during the developing step, even where the surfactant is at the high end of the preferred range described above. In contrast, conventional surfactants saturate the resist matrix, and thus cannot be easily removed.

In addition, the resist additive of the present disclosure has a polarity that is higher than that of the matrix polymer. The high polarity difference may enhance the additive diffusion to the surface of the resist layer, thereby being effective despite its low concentration, and thereby avoiding any adverse affects on lithographic performance. In contrast, conventional resist additives do not exhibit this polarity difference, and are thus less advantageous.

Figure 4:
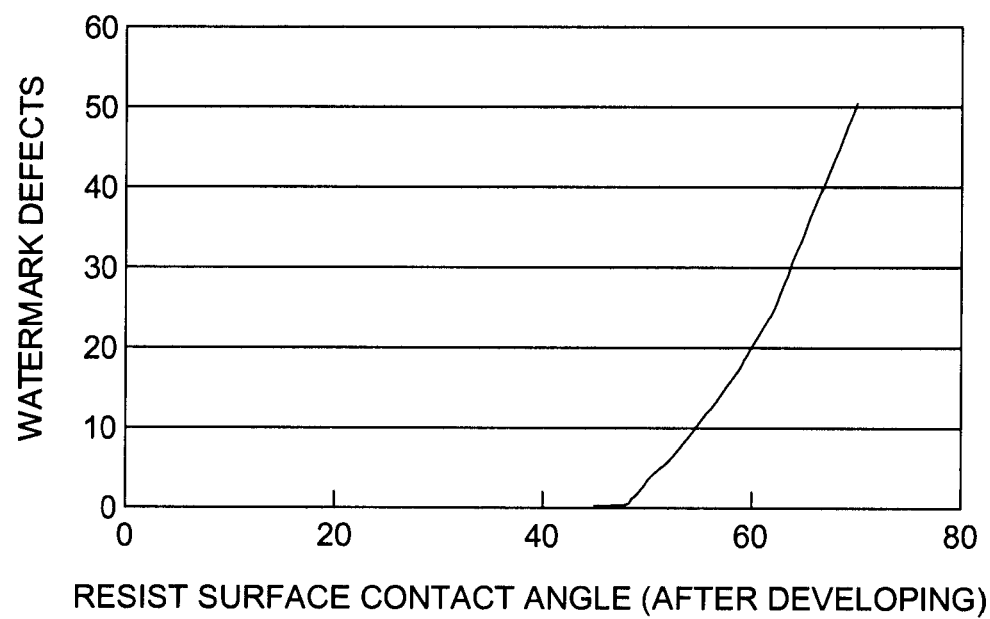
FIG. 4 is a chart depicting the relationship of the surface contact angle of a resist layer and the number of watermark defects thereon.

Referring to FIG. 4, illustrated is a chart depicting the relationship of the number of watermark defects to the resist surface contact angle, after the developing step. For isolation hole or trench patterns, among other resist pattern features, the resist surface contact angle can influence the frequency of developer water mark defect residue. As described above, the inventors have obtained unexpected experimental results demonstrating that if the conventional resist contact angle is higher than 60°, as measured after the developing step, there is a high risk of an undesirable number of watermark defects, which can dramatically reduce product yield and, therefore, increase product costs.

In view of all of the above and the figures, it should be evidence to those skilled in the pertinent art that the present disclosure introduces a method for forming a resist pattern, wherein the method comprises forming a resist layer over a substrate, exposing the resist layer with an immersion exposure tool, baking the resist layer, developing the resist layer to form the resist pattern, and increasing the resist pattern's contact angle by rinsing the substrate and resist pattern in a fluorine-containing liquid. The resist pattern's surface may substantially contain fluorine material after the liquid fluorine-containing rinse. Rinsing the resist pattern in the fluorine-containing liquid may reduce the resist pattern's thickness by less than about 20 angstroms. The method may further comprise rinsing the substrate and resist pattern in deionized water prior to rinsing in the fluorine-containing liquid, and/or rinsing the substrate and resist pattern in deionized water after rinsing in the fluorine-containing liquid. The method may further comprise spin-drying the substrate and resist pattern after the developing step. The fluorine-containing liquid may be selected from the group consisting of 3M Novec™ 4200, 3M FC-4434, 3M Novec™ 4300, 3M FC-4432, 3M Novec™ fluid HFE-7000, 3M Novec™ fluid HFE-7100, 3M Novec™ fluid HFE-7200, 3M Novec™ fluid HFE-7500, 3M Novec™ fluid HFE-71IPA, 3M Fluorinert™ FC-72, 3M Fluorinert™ FC-84, 3M Fluorinert™ FC-77, 3M Fluorinert™ FC-3255, 3M Fluorinert™ FC-3283, 3M Fluorinert™ FC-40, 3M Fluorinert™ FC-43, 3M Fluorinert™ FC-70, and 3M FC-4430. The fluorine-containing liquid may have a fluorine concentration, by weight, based on active content, ranging between about 1 ppm and about 50,000 ppm. For example, the fluorine concentration may range between about 100 ppm and about 5000 ppm. Developing the resist layer to form the resist pattern may use a developer containing 2.38% TMAH.

An immersion lithography resist material is also introduced in the present disclosure. In an exemplary embodiment, the material comprises a fluorine material having a molecular weight that is less than about 800 Dalton. A contact angle of an upper surface of the resist material may be substantially increased more than 3 degrees by the addition of fluorine material into the resist material. The fluorine material concentration may range between about 1 ppm and about 5%. The fluorine material loading of the resist surface may be higher than for the resist film body and under area. Fluoride molecules may be diffused into the resist material's upper surface and inhibit water interaction with substrate resist polymer during immersion exposure or developing. The resist material may be sensitive to immersion ArF, EUV and e-beam exposure tool. The fluorine material may be selected from the group consisting of 3M Novec™ 4200, 3M FC-4434, 3M Novec™ 4300, 3M FC-4432, 3M Novec™ fluid HFE-7000, 3M Novec™ fluid HFE-7100, 3M Novec™ fluid HFE-7200, 3M Novec™ fluid HFE-7500, 3M Novec™ fluid HFE-71IPA, 3M Fluorinert™ FC-72, 3M Fluorinert™ FC-84, 3M Fluorinert™ FC-77, 3M Fluorinert™ FC-3255, 3M Fluorinert™ FC-3283, 3M Fluorinert™ FC-40, 3M Fluorinert™ FC-43, 3M Fluorinert™ FC-70, and 3M FC-4430. The fluorine material amount by weight based on active content may range between about 1 ppm and about 5%.

Another method for forming an immersion lithography resist pattern, as introduced by the present disclosure, comprises forming a resist layer over a substrate, exposing the resist layer with an immersion exposure tool, baking the resist layer, forming a top antireflective coating (TARC) layer over the resist layer, and developing the resist layer to form the resist pattern.

Another method for forming an immersion lithography resist pattern, as introduced by the present disclosure, comprises forming a resist layer over a substrate, exposing the resist layer with an immersion exposure tool, baking the resist layer, developing the resist layer to form the resist pattern, forming a top antireflective coating (TARC) layer over the resist pattern, and rinsing the TARC layer.

The present disclosure also provides an immersion lithography resist material comprising a matrix polymer having a first polarity and an additive having a second polarity, wherein the second polarity is substantially greater than the first polarity. The additive may comprise between 0.01% and about 3% of the immersion lithography resist material, or the additive may comprise between 0.01% and about 2% of the immersion lithography resist material. The matrix polymer may have a first contact angle and the immersion lithography resist material may have a second contact angle, wherein the second contact angle may be substantially greater than the first contact angle. The additive may have a molecular weight that is less than about 1000 Dalton. The additive may comprise a fluorine-containing liquid, and may be selected from the group consisting of: 3M Novec™ 4200; 3M FC-4434; 3M Novec™ 4300; 3M FC-4432; 3M Novec™ fluid HFE-7000; 3M Novec™ fluid HFE-7100; 3M Novec™ fluid HFE-7200; 3M Novec™ fluid HFE-7500; 3M Novec™ fluid HFE-71IPA; 3M Fluorinert™ FC-72; 3M Fluorinert™ FC-84; 3M Fluorinert™ FC-77; 3M Fluorinert™ FC-3255; 3M Fluorinert™ FC-3283; 3M Fluorinert™ FC-40; 3M Fluorinert™ FC-43; 3M Fluorinert™ FC-70; and 3M FC-4430. The fluorine-containing liquid may have a fluorine concentration, by weight, based on active content, ranging between about 1 ppm and about 50,000 ppm, or between about 100 ppm and about 5000 ppm.

The present disclosure also provides an immersion lithography resist material comprising a matrix polymer having a first polarity and an additive having a molecular weight that is less than about 1000 Dalton and a second polarity that is substantially greater than the first polarity, wherein the matrix polymer has a first contact angle and the immersion lithography resist material has a second contact angle that is substantially greater than the first contact angle. The additive may comprise between 0.01% and about 3% of the immersion lithography resist material, or between 0.01% and about 2% of the immersion lithography resist material. The additive may comprise a fluorine-containing liquid, and may be selected from the group consisting of: 3M Novec™ 4200; 3M FC-4434; 3M Novec™ 4300; 3M FC-4432; 3M Novec™ fluid HFE-7000; 3M Novec™ fluid HFE-7100; 3M Novec™ fluid HFE-7200; 3M Novec™ fluid HFE-7500; 3M Novec™ fluid HFE-71IPA; 3M Fluorinert™ FC-72; 3M Fluorinert™ FC-84; 3M Fluorinert™ FC-77; 3M Fluorinert™ FC-3255; 3M Fluorinert™ FC-3283; 3M Fluorinert™ FC-40; 3M Fluorinert™ FC-43; 3M Fluorinert™ FC-70; and 3M FC-4430. The fluorine-containing liquid may have a fluorine concentration, by weight, based on active content, ranging between about 1 ppm and about 50,000 ppm, or between about 100 ppm and about 5000 ppm.

The present disclosure provides a method for forming a resist pattern comprising forming a resist layer over a substrate, wherein the resist layer comprises a matrix polymer having a first polarity. The resist layer is exposed with an immersion exposure tool, baked, and developed to form the resist pattern. The substrate and resist pattern are then rinsed in a fluorine-containing liquid having a second polarity that is substantially greater than the first polarity. The resist pattern's surface may substantially contain fluorine material after rinsing the substrate and resist pattern in the fluorine-containing liquid. Rinsing the resist pattern in the fluoride fluorine-containing liquid may reduce the resist pattern's thickness by less than about 20 angstroms. The fluorine-containing liquid may have a fluorine concentration, by weight, based on active content, ranging between about 1 ppm and about 50,000 ppm.

The present disclosure further provides a method for forming a resist pattern comprising forming a resist layer over a substrate, wherein the resist layer comprises a matrix polymer having a first polarity; exposing the resist layer with an immersion exposure tool; and baking the resist layer. The method further comprises forming a top anti-reflective coating ("TARC") layer on the resist layer; developing the resist layer to form the resist pattern; and rinsing the substrate, TARC layer, and resist pattern in a fluorine-containing liquid having a second polarity that is substantially greater than the first polarity.

The present disclosure also provides for a method for forming a resist pattern comprising forming a resist layer over a substrate, wherein the resist layer comprises a matrix polymer having a first polarity; exposing the resist layer with an immersion exposure tool; and baking the resist layer. The method further comprises developing the resist layer to form the resist pattern; forming a top anti-reflective coating ("TARC") layer on the resist pattern; and rinsing the substrate, resist pattern, and TARC layer in a fluorine-containing liquid having a second polarity that is substantially greater than the first polarity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a resist pattern, comprising:
    forming an immersion lithography resist layer over a substrate, wherein the immersion lithography resist layer comprises a matrix polymer having a first molecular weight and a first polarity and a perfluorocarbon surfactant having a second molecular weight and a second polarity, the perfluorocarbon surfactant including at least one selected from a group consisting of: perfluorohexane; perfluorodecane; perfluorocycloether; perfluoro-2-butyltetrahydrofuran; perfluorotripropylamine; a mixture of perfluorotri-n-butylamine and perfluoro-n-dibutylmethylamine; perfluorotributylamine; and perfluorotripentylamine, wherein a difference in the first and second polarities and a difference in the first and second molecular weights cause the perfluorocarbon surfactant to diffuse to a top surface of the immersion lithography resist layer, and wherein the at least one selected perfluorocarbon surfactant is hydrophobic and increases a water resistance of the immersion lithography resist layer;
    exposing the immersion lithography resist layer with an immersion lithography exposure tool;
    baking the immersion lithography resist layer;
    developing the immersion lithography resist layer to form the resist pattern; and
    rinsing the substrate and resist pattern in a fluorine-containing liquid,
    wherein the fluorine-containing liquid includes at least one selected from a group consisting of: perfluorohexane; perfluorodecane; perfluorocycloether; perfluoro-2-butyltetrahydrofuran; perfluorotripropylamine; a mixture of perfluorotri-n-butylamine and perfluoro-n-dibutylmethylamine; perfluorotributylamine; and perfluorotripentylamine.

2. The method of claim 1 wherein the resist pattern's surface substantially contains fluorine material after rinsing the substrate and resist pattern in the fluorine-containing liquid.

3. The method of claim 1 wherein the rinsing the resist pattern in the fluorine-containing liquid reduces the resist pattern's thickness by less than about 20 angstroms.

4. The method of claim 1 wherein the fluorine-containing liquid has a fluorine concentration, by weight, based on active content, ranging between about 1 ppm and about 50,000 ppm.

5. The method of claim 1 wherein the fluorine-containing liquid has a fluorine concentration, by weight, based on active content, ranging between about 100 ppm and about 5000 ppm.

6. The method of claim 1 further comprising, prior to the rinsing, rinsing the substrate and resist pattern with deionized water.

7. The method of claim 1 further comprising, subsequent to the rinsing, rinsing the substrate and resist pattern with deionized water.

8. The method of claim 1 further comprising, prior to and subsequent to the rinsing, rinsing the substrate and resist pattern with deionized water.

9. The method of claim 1, wherein the fluorine-containing liquid has a first surface tension and deionized water has a second surface tension, and wherein the first surface tension is less than the second surface tension.

10. A method comprising:
    forming an immersion lithography resist layer over a substrate, wherein the immersion lithography resist layer comprises a matrix polymer having a first molecular weight and a first polarity and a perfluorocarbon surfactant having a second molecular weight and a second polarity, the perfluorocarbon surfactant including at least one selected from a group consisting of: perfluorohexane; perfluorodecane; perfluorocycloether; perfluoro-2-butyltetrahydrofuran; perfluorotripropylamine; a mixture of perfluorotri-n-butylamine and perfluoro-n-dibutylmethylamine; perfluorotributylamine; and perfluorotripentylamine, wherein a difference in the first and second polarities and a difference in the first and second molecular weights cause a top surface portion of the immersion lithography resist layer to have a greater concentration of the perfluorocarbon surfactant than other portions of the immersion lithography resist layer, and wherein the at least one selected perfluorocarbon surfactant is hydrophobic and increases a water resistance of the immersion lithography resist layer;
    exposing the immersion lithography resist layer with an immersion lithography exposure tool;
    developing the immersion lithography resist layer to form a resist pattern;
    rinsing the resist pattern in a fluorine-containing liquid; and
    spin drying the substrate and the resist pattern,
    wherein the fluorine-containing liquid includes at least one selected from a group consisting of: perfluorohexane; perfluorodecane; perfluorocycloether; perfluoro-2-butyltetrahydrofuran; perfluorotripropylamine; a mixture of perfluorotri-n-butylamine and perfluoro-n-dibutylmethylamine; perfluorotributylamine; and perfluorotripentylamine.

11. The method of claim 10, wherein the difference in the first and second polarities and the difference in the first and second molecular weights cause the perfluorocarbon surfactant to diffuse to the top surface portion of the immersion lithography resist layer.

12. The method of claim 10, wherein the fluorine-containing liquid has a first surface tension and deionized water has a second surface tension, and wherein the first surface tension is less than the second surface tension.

13. The method of claim 10 wherein the fluorine-containing liquid reduces a contact angle of a surface of the immersion lithography resist layer.

14. A method, comprising:
forming an immersion lithography resist layer over a substrate, wherein the immersion lithography resist layer comprises a matrix polymer having a first molecular weight and a first polarity and a perfluorocarbon surfactant having a second molecular weight and a second polarity, the perfluorocarbon surfactant including at least one selected from a group consisting of: perfluorohexane; perfluorodecane; perfluorocycloether; perfluoro-2-butyltetrahydrofuran; perfluorotripropylamine; a mixture of perfluorotri-n-butylamine and perfluoro-n-dibutylmethylamine; perfluorotributylamine; and perfluorotripentylamine, wherein a difference in the first and second polarities and a difference in the first and second molecular weights cause the perfluorocarbon surfactant to diffuse to a top surface of the immersion lithography resist layer, and wherein the at least one selected perfluorocarbon surfactant is hydrophobic and increases a water resistance of the immersion lithography resist layer;

exposing the immersion lithography resist layer with an immersion lithography exposure tool;

baking the immersion lithography resist layer;

developing the immersion lithography resist layer to form a resist pattern;

rinsing the substrate and the resist pattern in a fluorine-containing liquid, wherein the fluorine-containing liquid has a first surface tension and deionized water has a second surface tension, wherein the first surface tension is less than the second surface tension, and wherein the fluorine-containing liquid includes at least one selected from the group consisting of: perfluorohexane; perfluorodecane; perfluorocycloether; perfluoro-2-butyltetrahydrofuran; perfluorotripropylamine; a mixture of perfluorotri-n-butylamine and perfluoro-n-dibutylmethylamine; perfluorotributylamine; and perfluorotripentylamine; and subsequent to the rinsing, rinsing the substrate and the resist pattern with deionized water.

15. The method of claim 14 further comprising, prior to the rinsing, rinsing the substrate and the resist pattern with deionized water.

16. The method of claim 14 wherein the at least one selected fluorine-containing liquid reduces a contact angle of a surface of the immersion lithography resist layer.

* * * * *